United States Patent
Leese de Escobar et al.

(10) Patent No.: US 10,234,514 B2
(45) Date of Patent: Mar. 19, 2019

(54) SYSTEM AND METHOD FOR BROADBAND FAR AND NEAR FIELD RADIO FREQUENCY RADIATION DETECTION USING SUPERCONDUCTING QUANTUM DETECTOR ARRAYS

(71) Applicants: Anna M. Leese de Escobar, Encinitas, CA (US); Marcio Calixto de Andrade, San Diego, CA (US); Susan Anne Elizabeth Berggren, San Diego, CA (US); Robert Lewis Fagaly, Carlsbad, CA (US); Benjamin Jeremy Taylor, Escondido, CA (US)

(72) Inventors: Anna M. Leese de Escobar, Encinitas, CA (US); Marcio Calixto de Andrade, San Diego, CA (US); Susan Anne Elizabeth Berggren, San Diego, CA (US); Robert Lewis Fagaly, Carlsbad, CA (US); Benjamin Jeremy Taylor, Escondido, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 156 days.

(21) Appl. No.: 15/360,323

(22) Filed: Nov. 23, 2016

(65) Prior Publication Data
US 2017/0146618 A1   May 25, 2017

Related U.S. Application Data

(60) Provisional application No. 62/259,574, filed on Nov. 24, 2015.

(51) Int. Cl.
*G01R 33/035* (2006.01)
*G01R 33/00* (2006.01)

(52) U.S. Cl.
CPC ..... *G01R 33/0354* (2013.01); *G01R 33/0023* (2013.01); *G01R 33/0076* (2013.01)

(58) Field of Classification Search
CPC .............................. H01Q 1/243; H01Q 13/02
(Continued)

(56) References Cited

U.S. PATENT DOCUMENTS

| 4,470,023 A | 9/1984 | Lukens et al. |
| 6,363,268 B1 | 3/2002 | Schuchardt et al. |

(Continued)

OTHER PUBLICATIONS

De Andrade, Marcio et al., Detection of Far-Field Radio-Frequency Signals by Niobium Superconducting Quantum Interference Device Arrays, IEEE Transactions on Applied Superconductivity, vol. 25, No. 5, Oct. 2015.

(Continued)

*Primary Examiner* — Graham P Smith
(74) *Attorney, Agent, or Firm* — SSC Pacific Patent Office; Arthur K. Samora; Kyle Eppele

(57) ABSTRACT

An antenna includes a plurality of superconducting quantum interference device (SQUID) arrays on a chip, and a printed circuit board (PCB) formed with a cutout for receiving the chip. The PCB is formed with a set of coplanar transmission lines, and the chip is inserted into the cutout so that each said transmission line connects to a respective SQUID array. A cryogenic system can cool the chip to a temperature that causes a transition to superconductivity for the SQUID arrays. A thermal radome can be placed around the chip, the PCB and the cryogenic system to maintain the temperature. A DC bias can be applied to the SQUID arrays to facilitate RF detection. The SQUID array, chip and CPW transmission lines can cooperate to allow for both detection of said RF energy and conversion of said RF energy to a signal without requiring the use of a conductive antenna dish.

19 Claims, 6 Drawing Sheets

(58) Field of Classification Search
USPC .......................................................... 343/772
See application file for complete search history.

(56) References Cited

U.S. PATENT DOCUMENTS

| | | |
|---|---|---|
| 6,690,162 B1 | 2/2004 | Schopohl et al. |
| 7,369,093 B2 | 5/2008 | Oppenlander et al. |
| 8,179,833 B2 | 5/2012 | Komev et al. |

OTHER PUBLICATIONS

Taylor, Benjamin et al., Characterization of large two-dimensional YBa2Cu3O7-δ SQUID arrays, IOP Superconductor Science and Technology, article 0953-2048-29-8-084003, published Jun. 3, 30, 2016.
Noel, Kelli M. et al., High Frequency Properties of High Voltage Barium Titanate-Ferrite Multiferroic Metamaterial Composites, IEEE Transaction on Dielectrics and Electrical Insulation, vol. 23, No. 5, Oct. 2016.

SYSTEM AND METHOD FOR BROADBAND FAR AND NEAR FIELD RADIO FREQUENCY RADIATION DETECTION USING SUPERCONDUCTING QUANTUM DETECTOR ARRAYS

CROSS REFERENCE TO RELATED APPLICATIONS

This application claims the benefit of U.S. provisional application 62/259,574, filed Nov. 24, 2015, by Anna Leese de Escobar et al., entitled "System And Method For Controlled, And Selective, Broadband Far And Near Field Radio Frequency Radiation Detector Utilizing Superconducting Quantum Detector Arrays". The contents of the '574 application are hereby incorporated by reference into this specification.

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 103292.

FIELD OF THE INVENTION

This invention pertains generally to antennas. More particularly, the present invention pertains to electrically small antennas. The invention is particularly, but not exclusively, useful as a method and system that can use Superconducting Quantum Interference Device (SQUID) arrays as electrically small antennas, or more generally electromagnetic field transducers, for detection of both far-field and near-field RF radiation without the need of any radiation gathering or focusing structure, or conductive antenna, as part of a receiving system.

BACKGROUND OF THE INVENTION

The concept of resonance is of fundamental importance in the field of antennas. More specifically, for resonant antennas, the size of the antenna can be directly related to the wavelength of the electromagnetic wave it is designed to detect, so that incident signals at the antenna benefit from a resonance condition which effectively provides amplification and allows easier readout with appropriate electronics. The resonance condition can substantially limit the frequency range over which an antenna can optimally perform. Small electric antennas that operate at lower frequencies can experience a loss in sensitivity when the wavelength of the incoming signal is large when compared to the conductive structures of the antenna, which can provide a weak resonant response. One limited solution for higher frequencies can be to use semiconductors and/or superconductors as electromagnetic radiation detectors that can detect photons and/or actively interact with the electromagnetic field eliminating the need to exploit the resonance condition. However, semiconductors and superconductors can have an intrinsic limit of operation at very high frequencies due to materials properties. The large size antennas at lower frequencies can limit their use for a variety of applications where available space is an issue.

SQUID arrays have been proposed in the prior art for utilization as radio frequency magnetic field detectors and as low noise amplifiers for existing primary antenna structures. These arrays of SQUIDs, which can be connected in a plurality of ways, are also known as Superconducting Quantum Interference Filters (SQIFs). Arrays consisting of the Josephson junctions, or any other arrays based on superconductivity that provide constructive interference patterns between the elements, either SQIFs or individual Josephson junctions, can also be utilized. However, there is no obvious way to provide a seamless solution for a system consisting of a SQIF chip (i.e., a SQUID array) with unique characteristics in conjunction with supporting structures that allows obtaining a calibrated transfer function for the broadband information carried by the free space electromagnetic waves. There is a need for a system of systems that can use of SQUID arrays as a far-field and near-field RF radiation detector with unique antenna characteristics, such as frequency, power, and temperature controls. Such a system could extend the concept of quantum detection of semiconductor devices to the entire frequency range of the electromagnetic spectrum, but satisfying all these requirements together in one device can be especially intricate.

In view of the above, it can be an object of the present invention to provide a size independent antenna for broadband detection of RF radiation without loss of sensitivity based on the detection of the energy present in the magnetic component of the incoming electromagnetic wave. Another object of the present invention can be to provide a SQIF antenna that both detects and amplifies incoming RF energy and converts that energy into a usable signal. Still another object of the present invention can be to provide a SQUID array antenna that does not require a dish or feed structure in order to detect incoming RF signals. Another object of the present invention can be to provide structures to help manage in ways other than to concentrate the electromagnetic energy, including DC magnetic field, in order to optimize the transfer function characteristics of the device in practice. Another object of the present invention can be to provide a three-dimensional (3D) SQUID array circuit or a three dimensional configuration of two dimensional squid arrays and/or any combination to account for the three axes of space. Still another object of the present invention can be to provide a size independent antenna for broadband detection of RF radiation that can be consistently fabricated in a cost-effective manner.

SUMMARY OF THE INVENTION

An antenna, or field to voltage transducer, in accordance with several embodiments of the present invention can include a plurality of superconducting quantum interference device (SQUID) arrays arranged on a chip and a chip carrier, such as a printed circuit board (PCB) formed with a cutout for receiving the chip. Although the characteristics of this PCB board are now being described herein, the carrier can be any structure that provides electrical connection to the chip such as leadless chip carriers as known and used in the semiconductor industry, or any other carrier variations. The PCB can be made of a thermally conductive material, such as Aluminum Nitride, Alumina in a Co-fired ceramic electronic package, or an injection molded ceramic. The PCB can be formed with a set of radio frequency co-planar waveguide (CPW) transmission lines, or other transmission lines or wave guides, and the chip can be inserted into the cutout so that each transmission line is connected to a respective SQUID array. A cryogenic system can be placed in thermal communication with the chip, in order to cool the chip to a temperature that causes a transition to the superconducting state for the SQUID arrays. A thermal radome can be placed around the chip, the PCB and the cryogenic system to maintain the desired temperature. The thermal radome can be constructed with materials that are electromagnetically transparent to the wavelengths of interest, and it may also have optimal thermal properties for the specific cryo-cooling and environmental conditions envisioned by the end user.

The SQUID arrays can be composed of any metallic elements such as Niobium, or ceramic, such as YBaCuO and DyBaCuO materials or any other superconducting material, whether pure metallic, alloy composition, or ceramic. The set of high-$T_c$ superconductors in the $YBa_2Cu_3O_x$ [6≤x≤7] family will also work as materials for the SQUIDs. When the SQUIDs are made of the Niobium, the temperature that should be maintained can be nine degrees Kelvin (T=9° K). Similarly, for SQUIDs of YBaCuO materials, the temperature that should be maintained can be below about ninety degrees Kelvin (T=90° K), as the optimum operating temperature would be about seventy-seven degrees kelvin (T=77° K). Still further, other materials that have been used to make SQUIDs including $Nb_3Ge$ along with BSCCO and Tl—Ba—Ca—Cu—O families can be used. Other organic superconductors could also be used. The antenna according to several embodiments can include a vacuum radome surrounding the thermal radome in a concentric relationship. A DC magnetic flux bias can be applied to the SQUID arrays to facilitate RF detection with optimal amplification, and a means for filtering the RF amplitude and frequency and or intentionally modifying the phase at the actual plane where the SQUID array is located can also be included as part of the system. The SQUID array chip and CPW transmission lines can cooperate to allow for both detection and amplification of RF energy and conversion of said RF energy to a signal without requiring the use of a conductive antenna dish, feed horn or similar type of aperture or structure, whether conductive or not, for receiving, detecting and amplifying the RF energy.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

Figure 1:
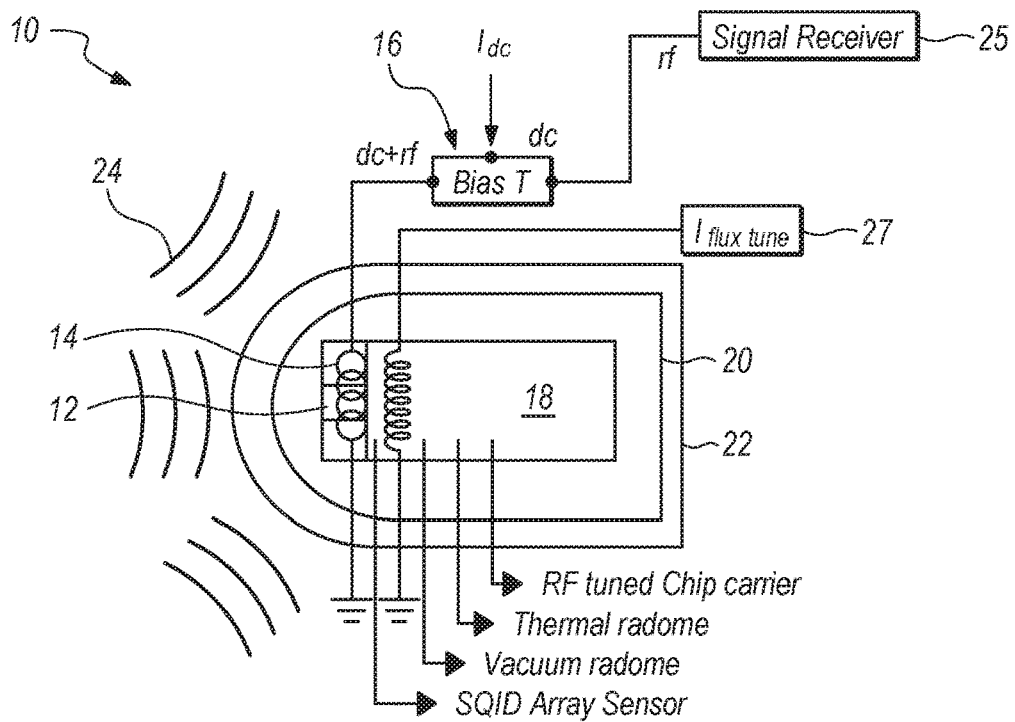
FIG. 1 is a block diagram of the antenna of the present invention according to several embodiments.

The paper entitled "Detection of Far-Field Radio-Frequency Signals by Niobium Superconducting Quantum Interference Device Arrays" by Marcio C. de Andrade et al., and published in IEEE's TRANSACTIONS ON APPLIED SUPERCONDUCTIVITY, Vol. 25, No. 5 (October 2015) is hereby incorporated by reference herein in its entirety.

The disclosure can pertain to a method and system to deliver Superconducting Quantum Interference Device (SQUID) arrays as electrically small antennas, as a real working antenna or sensor for far-field and near-field RF radiation without the need of any front end focusing or concentration or amplification of the signal by means of, any conductive aperture or any other structure, whether conductive or not, as part of a receiving system. The present invention can create a system of systems that provides the use of SQUID arrays as an antenna, as well as a sensor, to realize its use as a far-field RF and near-field RF radiation detector with unique antenna characteristics, such as frequency, power, and temperature controls. The present invention can create a system of systems that provides the use of SQUID arrays as an antenna, as well as a sensor, to realize its use as a far-field RF and near-field RF radiation detector with unique antenna characteristics, such as frequency, power, and temperature controls.

In brief overview, the concept of resonance is of fundamental importance in the field of metallic antennas. More specifically, for resonant antennas, the size of the antenna can be directly related to the wavelength of the electromagnetic wave it detects, so that incident signals at the antenna can be amplified and read with appropriate electronics. The resonance condition can substantially limit the frequency range over which an antenna can optimally perform. Small electric antennas that operate at higher frequencies can also experience a loss in sensitivity as the wavelength of the incoming signal is reduced. A limited solution for the latter case can be to use semiconductors and superconductors as RF detectors that can detect photons eliminating resonance condition. However, semiconductors and superconductors can have an intrinsic limit of operation to very high frequencies, which can imply the same limits for antennas made of these components. On the other hand, at lower frequencies, the magnitude of the signal can easily be detected due to the much larger sizes of the antennas. Nevertheless, the larger physical sizes of antennas at lower frequencies can limit the use of excessively large antennas for a variety of applications where space is limited.

The disadvantages of previous prior art efforts to harvest the quantum information present in free traveling electromagnetic waves can reside in having a sensor specifically designed not only to sense the RF radiation but to transform the acquired signals into meaningful information, and to operate at broadband with flat response as a function of the incoming frequency for free traveling waves in a variety of environments which may require optimization of the transfer function. Satisfying all these requirements together can be especially intricate.

With the above in mind, and referring now to FIG. 1, a representation of an antenna of the present invention that can overcome the disadvantages of the prior art can be shown and can be generally designated by reference character 10. As shown, antenna 10 can include a chip 12 having a plurality of superconducting quantum interference device (SQUID) arrays (the SQUID arrays are not shown in FIG. 1, but will be discussed in greater detail below). Chip 12 can be attached to chip holder 14, and a biasing means 16 can be electrically connected to the SQUID arrays to bias the arrays. A cryogenic sub-system 18 can be in thermal contact with chip 12 for maintaining the arrays at a temperature which is required for the SQUIDs and/or Josephson junctions to operate in the superconducting state. Chip 12, chip holder 14 and cryogenic system 18 can be surrounded by a thermal radome 20. Thermal radome 20 can further be surrounded by vacuum radome 22. With this structure RF radiation 24 can be detected and converted into a usable electrical signal, without requiring the use of an antenna aperture. RF 24 can be received at receiver 25 for further use by the end user (Not shown). Biasing component 27 can provide the necessary biasing for the SQUID to detect the RF waves 24. The structure and cooperation of structure of the components can be described more fully below.

The cryogenic sub-system 18 can be capable of temperature control from approximately 4° K up to 300° K. A vacuum environment can also be provided for the antenna 10 by a vacuum radome 22 that is transparent to broadband electromagnetic radiation but could contain the ability to control radiation. Vacuum radome 22 can isolate the SQUIDs and PCB 14 from any atmospheric variations. Additionally, it can have the appropriate properties of reducing loss of the incoming electromagnetic wave. For example, vacuum radome 22 can be made of a material with small loss tangent value. The antenna 10 can contain a thermal radome 20 to isolate the SQUID arrays on chip 12 from external temperature variations and to provide temperature control in the range described above. Chip carrier 14 can be specifically designed for properly operating over a wide range of operating frequencies.

Antenna 10 can also have a selective control of the incoming frequencies as part of the system. One such structure that can accomplish this selective control can be a low/high pass device to filter the incoming electromagnetic radiation for the system. For example, the antenna 10 can incorporate a three-dimensional (3D) grating structure and techniques that control the amplitude and frequency at the actual plane where the SQUID array is located is part of the system. These can be, for example, a surface selective material having frequency dependent RF properties, i.e., permittivity, permeability, loss tangent, etc., added in front of the SQUID array between chip 12 and thermal radome 20 to function in selecting frequencies reaching the SQUID arrays. Once such example is described in a paper by K. M. Noel et al., entitled "High Frequency Properties Of High Voltage Barium Titanate-Ferrite Multiferroic Metamaterial Composites", IEEE Transactions on Dielectrics and Electrical Insulation Vol. 23, No. 5; October 2016. The film coating of Noel et al. can have a frequency dependent loss tangent which could be useful. Similar materials could be engineered with desired properties. Such a surface material can also be applied as a coating to either the thermal or vacuum radome structures on either the internal or external surfaces.

The external radome 22 can function as an external vacuum barrier, to assist in isolating the chip 12 from external higher temperatures and to avoid any condensation of gases within the antenna 10 and its surrounding thermal radome 20. The temperature can be below about 9° K (T=9° K) if the SQUIDs are made of Niobium, or below about 90° K (T=90° K) if the SQUIDs in the arrays are made of a high temperature superconductors such as YBaCuO and similar (e.g., DyBaCuO) compounds. The set of high-$T_c$ superconductors in the $YBa_2Cu_3O_x$ [6≤x≤7] family could also work as materials for the SQUIDs. Cryogenic system 18 can be set to maintain any temperature appropriate to insure that the SQUIDs that make up the array will exhibit superconductivity, based on the material from which they are fabricated. For example, the temperature of cryogenic system 18 can be about 130° K (T=130° K) for mercury-based SQUID superconductors, or about 50° K (T=50° K) for iron-based superconductors. A table of example materials that could be used for SQUIDs and their corresponding critical temperatures for superconductivity (which should be maintained by cryogenic system 18) can be included below. The table is not all-inclusive.

| Table of Superconductors | |
|---|---|
| | $T_C(° K)$ |
| Al | 1.2 |
| In | 3.4 |
| Sn | 3.72 |
| β-Hg | 3.95 |
| α-Hg | 4.15 |
| Pb | 7.19 |
| Nb | 9.26 |
| NbTi | 10 |
| NbN | 16 |
| $Nb_3Al$ | 18 |
| $Nb_3Sn$ | 18.3 |
| $Nb_3Ge$ | 23.2 |
| $C_{60}Rb_X$ | 28 |
| $C_{60}Cs_2Rb$ | 33 |
| $MgB_2$ | 39 |
| $YBa_2Cu_3O_7$ | 92 |
| $Bi_2Sr_2CuO_6$ | 20 |
| $Bi_2Sr_2CaCu_2O_8$ | 85 |
| $Bi_2Sr_2Ca_2Cu_3O_{10}$ | 110 |
| $Tl_2Ba_2CuO_6$ | 80 |
| $Tl_2Ba_2CaCu_2O_8$ | 108 |
| $Tl_2Ba_2Ca_2Cu_3O_{10}$ | 125 |
| $TlBa_2Ca_3Cu_4O_{11}$ | 122 |
| $HgBa_2CuO_4$ | 94 |
| $HgBa_2CaCu_2O_6$ | 128 |
| $HgBa_2Ca_2Cu_3O_8$ | 134 |

The antenna 10 can provide temperature adjustments for any transition temperature down to about 4° K (T=4° K); the system can also be modified to achieve much lower temperatures. Subsequently the SQUID array location, together with the engineered PCB board can be subject to a vacuum not higher than about $1 \times 10^{-5}$ mbar. The vacuum condition may often be necessary for the reduction of the thermal load on the refrigeration system for cryogenic system 18 as well as to avoid degradation of system performance or circuits due to ice formation.

Figure 2:
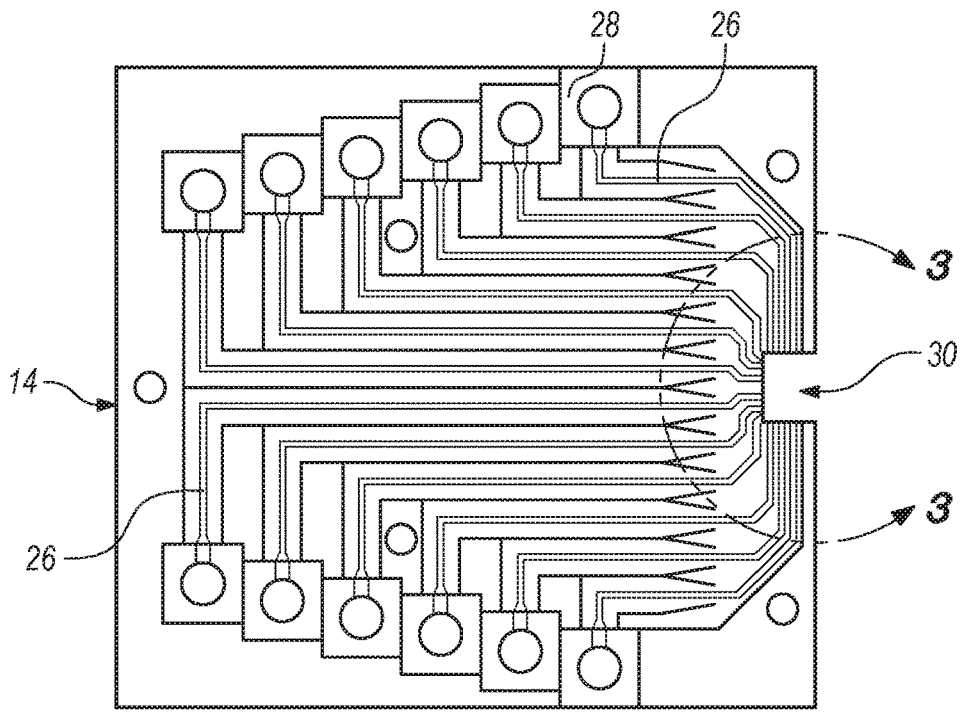
FIG. 2 is a top plan view of the chip holder portion of the antenna of FIG. 1.
Figure 3:
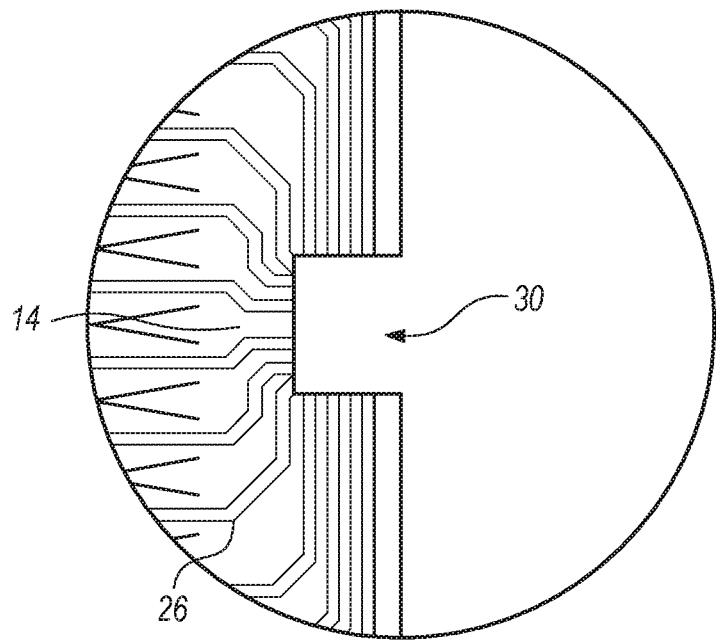
FIG. 3 is an top plan view taken along line 3-3 in FIG. 2.

The external vacuum radome 22 can also be coated with infrared reflective material on the internal surface, the external surface, or both, of vacuum radome 22, to assist on keeping the temperature stable at the sensor position. The vacuum radome may also be transparent to broadband electromagnetic radiation. Thermal radome 20 can be concentric to the vacuum radome 22, and can also be transparent to broadband electromagnetic radiation. Thermal radome 20 can be made of a high thermal conductivity material that exhibits such conductivity at temperatures below room temperature but higher than the SQUID final temperature (the temperature at which the SQUIDs for 10 exhibit superconductivity) to assist on removing any heat directed at the device. With this configuration, the antenna can be specifically engineered to maximize the absorbed energy in the magnetic field component of the incoming electromagnetic wave. The chip carrier 14 and the radomes 20, 22 can be properly designed, as mentioned before, to be transparent to well beyond ultra-wideband frequencies, and also to avoid any interference between fields due to resonance conditions in surrounding structures and the non-resonant response of the device Referring now to FIGS. 2 and 3, chip holder 14 can be seen in greater detail. As shown, chip holder 14 can include a printed circuit board (PCB) which can provide a set of radio frequency co-planar waveguide (CPW) transmission lines 26 to and from the SQUID arrays on chip 12. Other RF lines such as striplines or microstrips could be used. The PCB can serve as an interconnection between micro-coaxial cables (not shown) with connectors 28 that can operate at broadband, such as GPO® connectors (manufactured by Corning Gilbert, Inc.) and co-Ground-Signal-Ground inputs to the SQUID arrays on chip 12. Chip holder 14 can be formed with a cutout 30 for receiving chip 12. As shown in FIG. 3, transmission lines 26 can be formed in pairs terminating at cutout 30 in the chip holder 14. The SQUID array chip may be placed in cutout 30 and mounted in thermal communication to good thermally conducting non-metallic materials, such as the ceramic compound Aluminum Nitride (ALN) thermal carrier, for attachment to a cryogenically cooled copper cold finger. The thermal carrier and cold finger can be included as part of cryogenic system 18.

The radomes 20, 22 and the PCB 14 (or other electronic circuit board) can be made of materials and assembled in a manner so that the result does not have any resonant response to RF radiation 24. Such a response will distort the local RF field by absorbing energy in a range of frequency about the resonant frequency. The effect would either (in the case of the radomes) reduce the power in the RF field that the SQUID array (SQA) can detect—thereby reducing the output SQA power, or (in the case of the PCB 14) act as an antenna and pull in power to the electrical lines connecting the SQA to the external electronics—thereby adding to and/or distorting the RF output signal from the SQA The thermal carrier and PCB can form a permanent test fixture that can be wire-bonded with a single SQUID array chip located in cutout 30 at one end of the PCB chip holder 14. The permanent fixture can also be designed so that no wire-bonds are required, but electrical contact be made by means of pressure contacts such as the leadless chip carrier commonly used in the semiconductor industry. Other variants for the electrical contact such as pressure pins can be used. Any other structure providing electrical contacts with the chip without the need of wire bonds could also be used. A wide range of SQUID array chip geometries with various pin-outs can be mounted; PCBs can be tailored to a specific SQUID array device. A calibration procedure may also be necessary for proper functioning of the apparatus. It may be done using symmetric pairs of input and output CPW transmission lines terminated by CPW thru-lines, shorts, and opens utilizing the area normally occupied by the chip being calibrated. In this way, the embedding S-parameters of the PCB, connecting cables, connectors, etc. can be determined. De-embedded SQUID array device parameters can be determined. The inherent non-reciprocal DC SQUID array response can be isolated and observed. The output impedance of the SQUID array chip can be designed for proper matching. The design of the chip carrier 14 and the surrounding structures, including thermal radome 20 and vacuum radome 22, can allow beyond ultra-wide band operation, allowing continuous exposure of the sensor to incoming electromagnetic radiation.

As mentioned above, in order to have selectivity of the frequencies reaching the antenna 10 without overwhelming the antenna 10 with broadband incoming radiation information, it may be important to include a selective control of the incoming frequencies as part of the system. A structure that can operate as a low/high pass device to filter the incoming electromagnetic radiation (not shown in the Figures) may be a component of the system. For example, a 3D grating structure and techniques that control the amplitude and frequency at the actual plane where the SQUID array is located is part of the system. These can be, for example, a surface selective material added in front of the SQUID array to function in selecting frequencies reaching the array. Alternatively, coating such as those proposed by Noel, or other materials, could be used.

Figure 4:
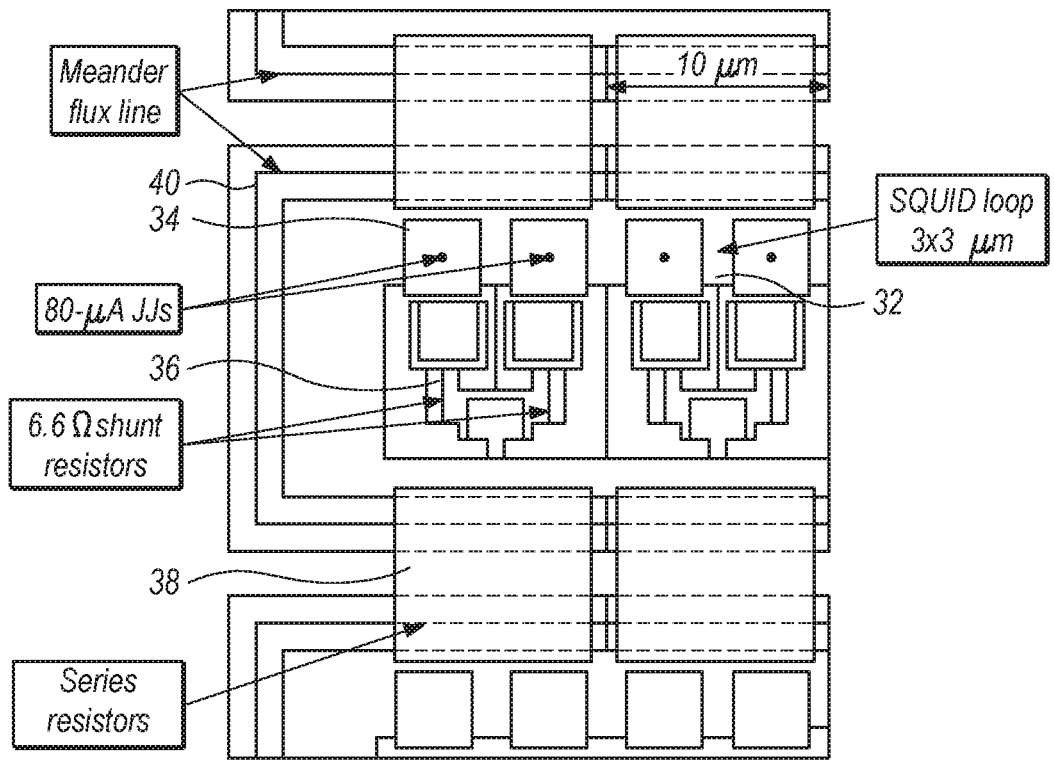
FIG. 4 is a top plan view of a portion of the superconducting quantum interference device (SQUID) array on the chip of the antenna of FIG. 1.
Figure 5:
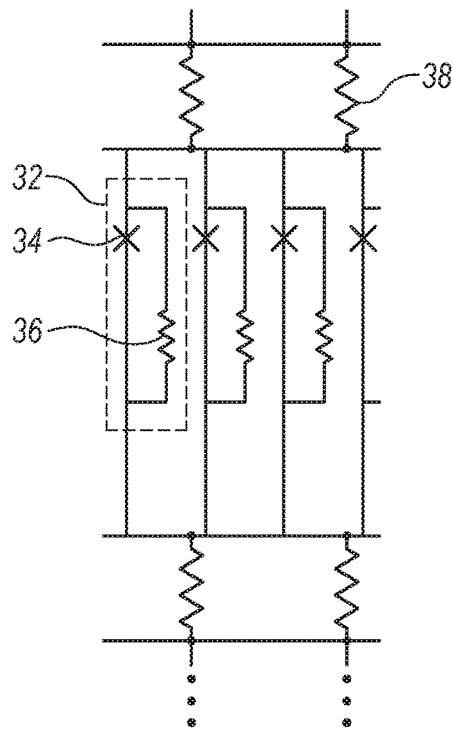
FIG. 5 is an electrical circuit representation of the portion of the SQUID array shown in FIG. 4.

Referring now to FIGS. 4 and 5, a portion of the SQUID array is shown in greater detail. As mentioned above, a SQUID array for chip 12 can be designed to capture travelling electromagnetic radiation and to match the chip carrier specifically designed to maximize the absorbed energy (Poynting vector). This can be done by using of multiple SQUID loops 32 that can have different combinations of sizes, and connected in parallel or in series. The number of Josephson junctions 34 in the loops 32 can also vary from two to more. For example, a loop with three Josephson junctions can also be used as an element of many different loops to form an array. The arrays can also a plurality of shunt resistors 36 for the Josephson junctions, as well as series resistor 38 between Josephson junctions, as shown in FIGS. 4 and 5. A serpentine meandering current line 40 can also be included in the array to flux bias the SQUIDs. It should be appreciated, however, the structure described in FIGS. 4 and 5 is can be used in conjunction with Niobium SQUIDs. Other methods for biasing the SQUIDs can be used, particularly in conjunction with SQUIDs that incorporate step edge processes.

Chip 12 may be designed to capture travelling electromagnetic radiation and to match the chip carrier specifically designed to maximize the absorbed energy (Poynting vector). This can be accomplished using a single line (for biasing the device and extracting energy from the SQIF chip) coupled to a Bias-T. The biasing structure is described more fully in the above-cited "Detection of Far-Field Radio-Frequency Signals by Niobium Superconducting Quantum Interference Device Arrays" paper by Marcio C. de Andrade et al., which has been incorporated by reference herein. The magnetic flux can also be manipulated by biasing means 27 to ensure optimal operation of the antenna 10 in changing environments.

In additional to the description of the biasing structures, the above-cited de Andrade et al. paper recites SQUIDs made of Niobium materials. However, it should be appreciated that the SQUIDs could also be made of any element with a quantum response that gives rise to a Josephson effect including, but not limited to, superconductor-insulator-superconductor (SIS) tunnel junctions, Superconductor-NormalMetal-Superconductor (SNS), bi-SQUIDs, grain boundary, bi-crystal, step-edge, ramp-edge and ion damage junctions. The cited variety of arrays can also have a distribution of sizes, diameters, lengths, and thickness in order to optimize the energy detection efficiency and transfer function, for example, with respect to linearity, power tolerance or flux bias requirements.

Figure 6:
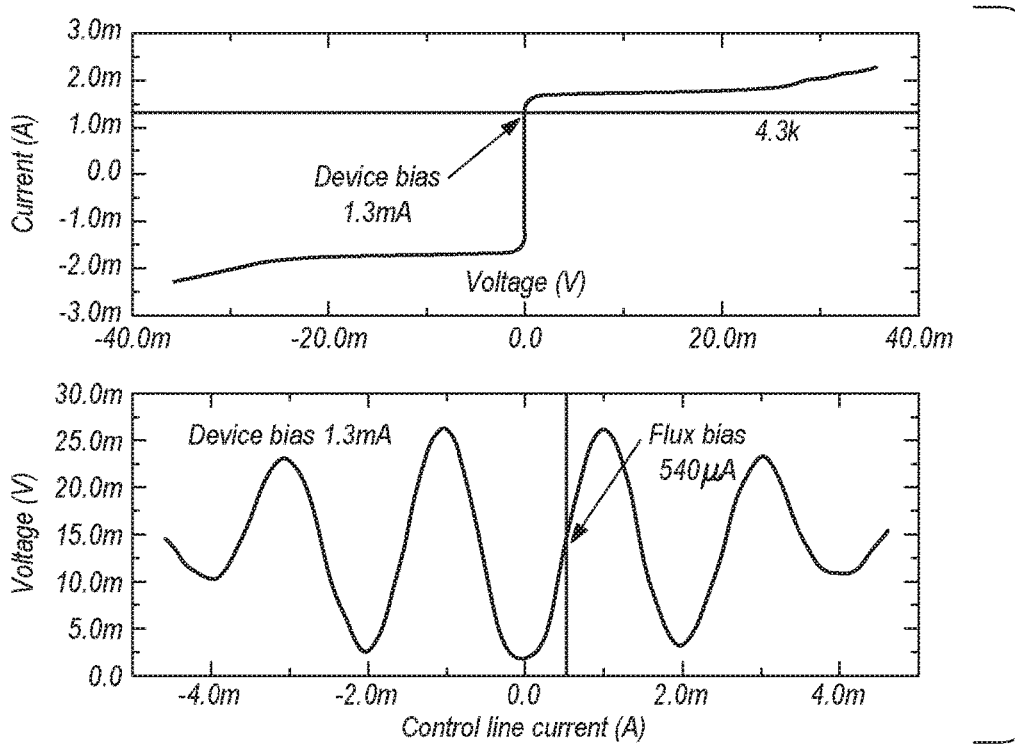
FIG. 6 is a graph of voltage and current versus control line current, which can be the result of the biasing procedure used by the array of FIG. 5.

For operation of the SQUID array as mentioned above, and referring now to FIGS. 6, 7A and 7B, a bias current versus voltage response (I-V) is measured to find the optimum value for the bias current where the array is operating optimally in the superconducting state. A typical I-V curve is shown in FIG. 6, where the bias current is set to an optimum point, "device bias". In FIG. 6, current bias for antenna 10 can be set to 1.3 mA. Once the device bias has been established, the collective response of the array can be obtained by introducing a small amount of magnetic flux to the array by flowing a small controlled current in an embedded line (meander line 40) within the chip. This small amount of magnetic flux sets the array into the detection mode. Once this process is completed the array is ready to detect incoming electromagnetic radiation.

Figure 7A:
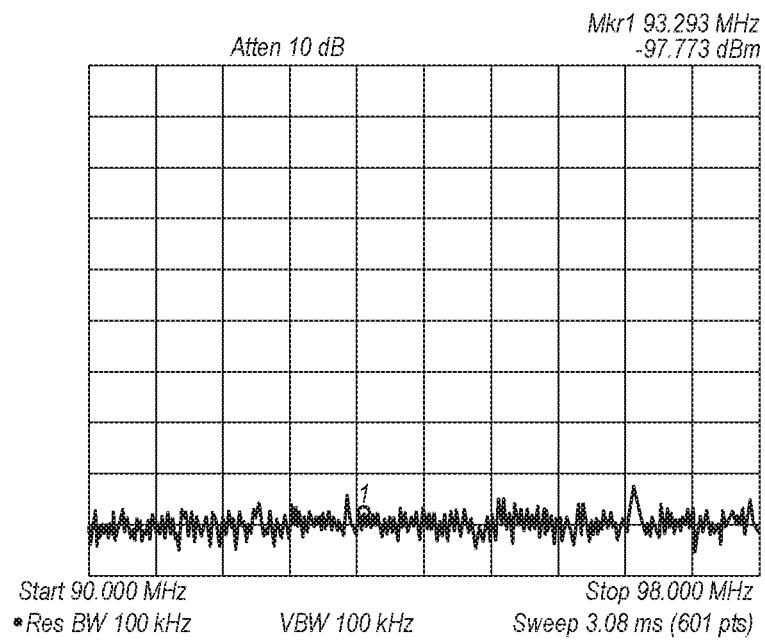
FIG. 7A is a snapshot of a spectrum analyzer output of RF receiver by the antenna of FIG. 1, prior to biasing.
Figure 7B:
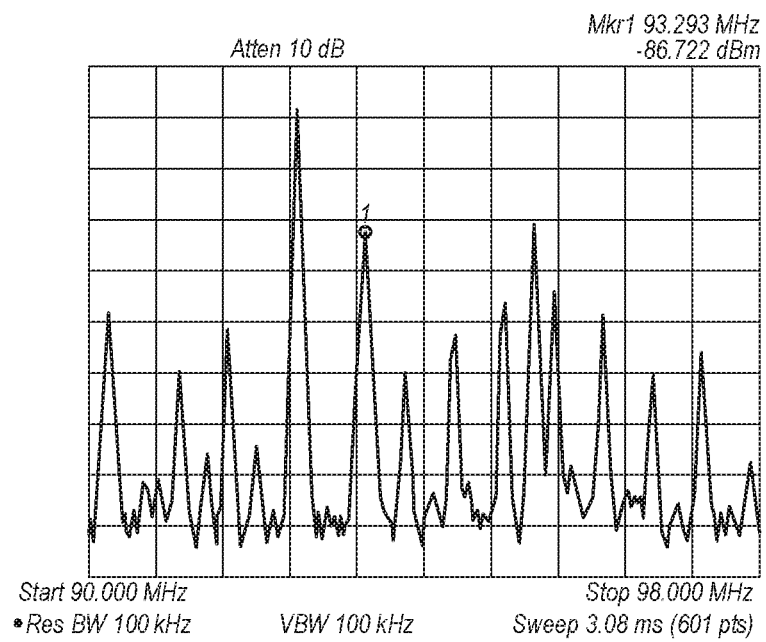
FIG. 7B is the same snapshot as FIG. 7A, but after the biasing procedure of the present invention has occurred.

This bias flux can be important to control in order to maintain optimal operation and positioning on the transfer function of the device. In practice, a system to maintain and control this flux on the device can be an important element for enabling operation of the system in real world environments where conditions may change constantly. FIG. 7A shows the spectrum analyzer output prior to biasing, while FIG. 7B illustrates the output of spectrum analyzer 42 after the biasing has occurred. The peaks in FIG. 7B correspond to several local radio stations, which were detected by the antenna 10 after biasing.

With a system set-up as described above, it is possible to obtain an antenna response, where antenna 10 is an operational system, which can detect local free traveling electromagnetic waves. Such results can be seen in FIGS. 6A and 6B. It is important to notice that the results represented in FIGS. 6A and 6B are shown to exemplify the ability of a system concept to realize the detection of far field electromagnetic radiation at different power and frequencies.

The anti-peak linearity and size can be optimized by varying the critical current of the additional junction of each bi-SQUID. The layout implementation of the tight 2D array integration leads to distinct geometries such as a diamond shape formed by merged dual bi-SQUID cells designed to maximize the energy captured by travelling electromagnetic radiation. The system can also consist of an optimized thermal management interface to isolate the chip and chip carrier from external ambient temperature allowing it to cool to the operating temperature. For operation of the antenna 10, it can be necessary to set the cryogenic system 18 at the appropriate temperature for the superconducting transition of the material from which the SQUID array chip is fabricated. The thermal management interface typically requires the addition of a concentric radome operating at lower temperature than the vacuum radome, and at a higher temperature than the device for temperatures below approximately fifty degrees Kelvin (T=50° K).

An embodiment of the antenna 10 can consist of a SQUID array designed to be able to capture the Poynting vector, which can be known in the prior art as "energy current density" or "power flux." The (SI) units of the Poynting vector are Watts per meter squared (W/m$^2$), and the Poynting vector can be a good representation of the rate of the average energy flow per unit area of a free traveling electromagnetic wave. A supporting structure to transform information of the electromagnetic wave to a proportionate electrical signal. A sensitive magnetic field detector based on a quantum response, such as e.g., an array of SQUID sensors, or any element that can give rise to a Josephson effect, including, a series of Josephson junctions in the same plane, can be used to capture the Poynting vector. Different geometries of the fundamental building block of SQUID arrays could also be used. For example, a single SQIF, consisting of one or more bi-SQUID array designs based on a tight integration of individual bi-SQUID cells sharing inductances with adjacent cells where the phase dynamics and linearity of the array voltage response is optimized so the non-uniformity in inductances of the bi-SQUIDs produces a pronounced zero-field single anti-peak in the voltage response, as described above, could be used.

By capturing the Poynting vector based on quantum response, the SQUID array can be used in a number of configurations to locate the position of a transmitted signal. These techniques include, but are not limited to, single antenna techniques that fall into amplitude comparison and phase comparison methods along with multiple antenna techniques. Single antenna techniques can use angle of arrival (AOA) methods to determine a line of bearing (LOB) to the point of origin of a transmitted signal. The AOA can be determined by measuring the relative magnitude of the vector (in this case, the magnetic field) components of the transmitted electromagnetic (EM) wave. Other methods obtain AOA by measuring the phase of the EM signal or (in the case of multiple spatially separated antennae, the time difference of arrival (TDOA). The disadvantage of basic LOB techniques is that there may be a 180° ambiguity in determining the direction to the transmitted signal. By taking multiple measurements at spatially differentiated positions, it can be possible to triangulate the location of the signal source.

Figure 8:
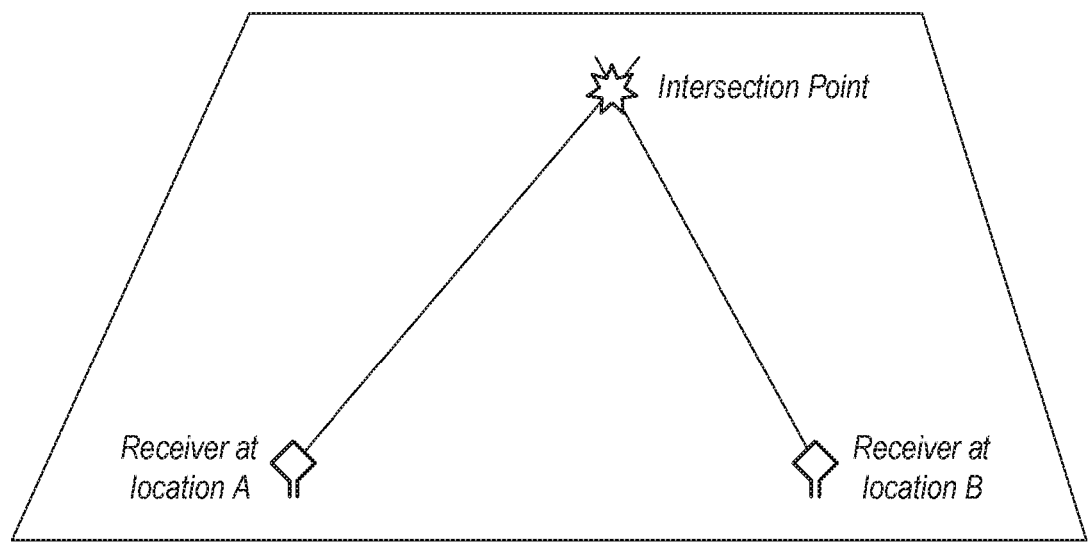
FIG. 8 is diagram which illustrates how the antenna of FIG. 1 can be used for direction finding by triangulation.

Referring now to FIG. 8, the direction finding by triangulation method is shown. The triangulation method can be used to determine the location of a transmitted signal by measuring both the electric (E) and magnetic (B) field components of the Poynting vector, which is the cross-product of the E and B fields (E×B). The negative of the unit vector (k) of the Poynting vector will uniquely point to the origin of the transmitted signal (FIG. 8). With knowledge of local terrain, airborne (or sufficiently elevated) E×B detection systems can uniquely locate the position of transmitted signal with a single antenna system. 2-dimensional (e.g., AOA) direction finding that eliminates the 180° ambiguity can be achieved with a 3-axis ($B_x$, $B_y$, E,) antenna system.

Figure 9:
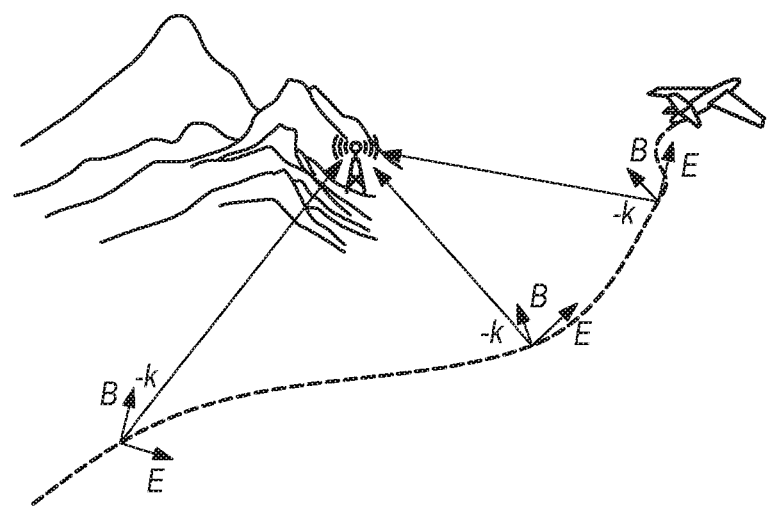
FIG. 9 is a diagram which illustrates how the antenna of FIG. 1 can be used for direction finding by Poynting vector geolocation; and, FIG. 10 is a block diagram, which represents steps that can be taken to accomplish the methods of the present invention according to several embodiments.

In still other embodiments, and referring now to FIG. 9, the antenna 10 of the present invention can be used for direction finding by Poynting vector geolocation. Note that the position of the transmitter can be determined by a single measurement. Subsequent measurements can add redundancy and improve signal to noise.

The advantages of SQUID arrays can include, but are not limited to, small antenna sensitivity, small physical dimensions relative to the wavelengths of interest, frequency independent amplitude response and frequency independent phase response.

Additional uses of such SQUID arrays can include, but are not limited to, magnetic anomaly detection (MAD), bio-magnetism, geophysics, non-destructive testing (e.g., magnetic microscopy). In applications where flux resolution is more important than field sensitivity (e.g., magnetic microscopy where the object(s) being scanned are quite close to the SQUID array sensor), SQUID arrays can offer far greater magnetic moment resolution than currently available SQUID sensors utilizing flux transformers, fractional SQUIDs or individual bare loops. Inductively coupling an eternal coil to the SQUID array can allow the SQUID array to directly sense electrical currents.

Figure 10:
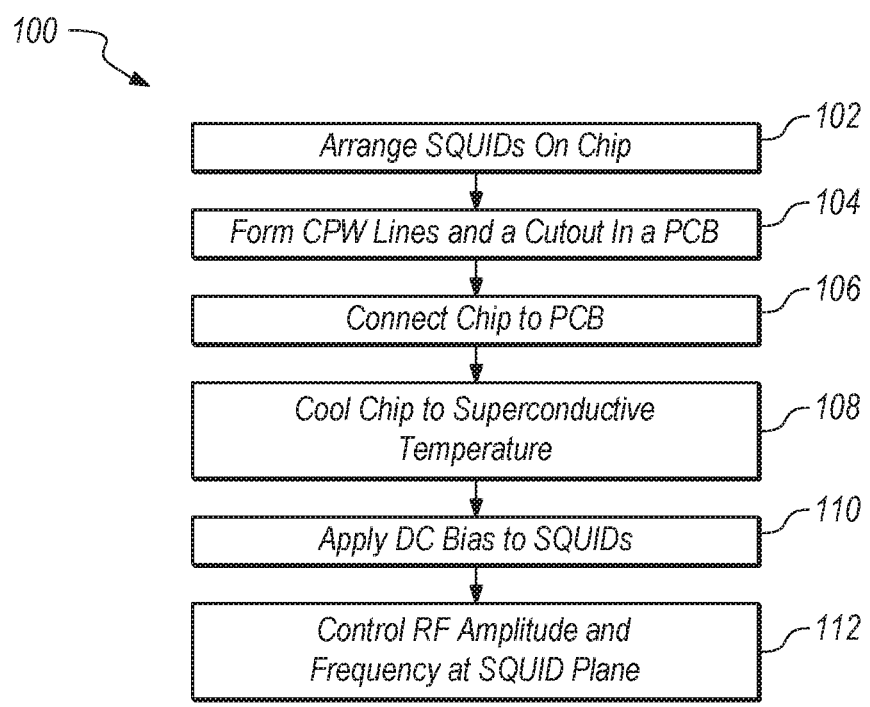

Referring now to FIG. 10, a block diagram is shown, which can illustrate one of several methods 100 of the present invention which be accomplished. As shown, method 100 can include the initial step 102 of arranging a plurality of SQUIDs as arrays on chip 12, followed by forming a set of RF CPW transmission lines and a cutout in a printed circuit board (PCB), as shown by step 104. Next, and as shown by block 106, the step of connecting the chip to the PCB so that each transmission line is electrically connected to a respective SQUID in the array can be accomplished. Also, the chip 12 can be cooled to a temperature that causes a transition to superconductivity for said SQUID arrays, as shown by step 108. A DC bias can be applied to the SQUID arrays (step 110), and the amplitude and frequency at the actual plane where the SQUID array is located as part of the system can be controlled, step 112. The method steps shown in FIG. 10 can be accomplished the structure and cooperation of structure described above.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An antenna comprising:
   at least one array of a plurality of superconducting quantum interference devices (SQUIDs) arranged on a chip;
   a printed circuit board (PCB) formed with a cutout for receiving said chip, said PCB also being formed with at least one set of radio frequency co-planar waveguide (CPW) transmission lines, with each said at least one transmission line connected to a respective said array;
   a cryogenic system in thermal communication with said chip for maintaining said chip at a temperature that causes a transition to superconductivity for said plurality of SQUIDs; and
   a thermal radome surrounding said chip, said PCB, and said cryogenic system.

2. The antenna of claim 1 further comprising a vacuum radome surrounding said thermal radome.

3. The antenna of claim 2, wherein said SQUIDs comprise materials selected from a group consisting essentially of Niobium, $YBa_2Cu_3O_x$, wherein $x \approx 6.92$, and DyBaCuO.

4. The antenna of claim 3, wherein said SQUIDs comprise Niobium and the cryogenic system maintains said temperature in a range of up to approximately nine degrees Kelvin (T=9° K).

5. The antenna of claim 3 wherein said SQUIDs comprise $YBa_2Cu_3O_x$, wherein $x \approx 6.92$, and said cryogenic region maintains said temperature at approximately ninety degrees Kelvin (T=90° K).

6. The antenna of claim 1 further comprising a DC bias applied to said SQUID arrays.

7. The antenna of claim 1, wherein said SQUID arrays define a plane, and further comprising means for controlling an amplitude and a frequency at said plane, and further being located between said vacuum radome and said thermal radome.

8. The antenna of claim 1, wherein said SQUIDs from said arrays are selected from a group consisting essentially of superconductor-insulator-superconductor (SIS) tunnel junctions, Superconductor-NormalMetal-Superconductor (SNS), bi-SQUIDs, grain boundary, bi-crystal, step-edge, ramp-edge, and ion damage junctions.

9. The antenna of claim 1, wherein said SQUID array, said chip and said CPW transmission lines cooperate to allow for both detection of said RF energy and conversion of said RF energy to a signal without requiring the use of a conductive antenna dish to receive said RF energy.

10. A method of detecting RF energy comprising:
    arranging a plurality of superconducting quantum interference devices (SQUIDs) in arrays on a chip;
    forming a set of radio frequency co-planar waveguide (CPW) transmission lines and a cutout in a printed circuit board (PCB);
    connecting said chip to said PCB so that each said transmission line is electrically connected to a respective said SQUID array; and
    cooling said chip to a temperature that causes a transition to superconductivity for said SQUIDs.

11. The method of claim 10, wherein cooling comprises:
    placing a cryogenic system in thermal communication with said chip; and,
    surrounding said cryogenic system, said chip and said PCB with a thermal radome.

12. The method of claim 11, where cooling further comprises:
    enclosing said thermal radome with a vacuum radome, wherein said vacuum radome is concentric with said thermal radome.

13. The method of claim 10, wherein arranging comprises using SQUIDs comprising materials selected from a group consisting essentially of Niobium, YBaCuO, and DyBaCuO.

14. The method of claim 13, wherein said SQUIDs comprise Niobium and cooling is accomplished so that said temperature is approximately nine degrees Kelvin (T=9° K).

15. The method of claim 13, wherein said SQUIDs comprise YBaCuO and cooling is accomplished so that said temperature is about ninety degrees Kelvin (T=90° K).

16. The method of claim 10, further comprising:
    applying a DC bias to said SQUID arrays.

17. The method of claim 16,
    wherein said RF energy comprises an amplitude and a frequency, and
    wherein said SQUID arrays define a plane, and further comprising:
  controlling said amplitude and said frequency at said defined by said SQUID array.

18. The method of claim 17, wherein arranging, forming, connecting, cooling, applying, and controlling are accomplished so that both detection of said RF energy and conversion of said RF energy to a signal is accomplished without the use of a conductive structure as part of a sub-system for receiving said RF energy.

19. The method of claim 10, wherein said SQUIDs are selected from a group consisting essentially of superconductor-insulator-superconductor (SIS) tunnel junctions, Superconductor-NormalMetal-Superconductor (SNS), bi-SQUIDs, grain boundary, bi-crystal, step-edge, ramp-edge, and ion damage junctions.

\* \* \* \* \*